(12) United States Patent
Shah

(10) Patent No.: US 7,800,675 B2
(45) Date of Patent: Sep. 21, 2010

(54) METHOD OF OPERATING A STORAGE GATE PIXEL

(75) Inventor: Joey Shah, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 1285 days.

(21) Appl. No.: 10/924,961

(22) Filed: Aug. 25, 2004

(65) Prior Publication Data

US 2006/0044437 A1 Mar. 2, 2006

(51) Int. Cl.
*H04N 5/335* (2006.01)
*H01L 27/00* (2006.01)
(52) U.S. Cl. .................. 348/308; 348/299; 250/208.1
(58) Field of Classification Search ................. 348/308, 348/299, 314, 241, 243; 257/291, 292; 250/208.1
See application file for complete search history.

(56) References Cited

U.S. PATENT DOCUMENTS

| | | | | |
|---|---|---|---|---|
| 6,166,768 A | * | 12/2000 | Fossum et al. | 348/308 |
| 6,307,195 B1 | * | 10/2001 | Guidash | 348/308 |
| 6,486,503 B1 | * | 11/2002 | Fossum | 257/292 |
| 6,667,768 B1 | * | 12/2003 | Fossum | 348/308 |
| 6,850,278 B1 | * | 2/2005 | Sakurai et al. | 348/302 |
| 7,015,964 B1 | * | 3/2006 | Koizumi et al. | 348/308 |
| 7,259,790 B2 | * | 8/2007 | Mabuchi et al. | 257/292 |
| 7,271,835 B2 | * | 9/2007 | Iizuka et al. | 348/314 |
| 2004/0041077 A1 | * | 3/2004 | Fossum | 348/302 |
| 2005/0110884 A1 | * | 5/2005 | Altice et al. | 348/302 |
| 2005/0110885 A1 | * | 5/2005 | Altice et al. | 348/241 |

* cited by examiner

*Primary Examiner*—Nhan T Tran
(74) *Attorney, Agent, or Firm*—Dickstein Shapiro LLP

(57) ABSTRACT

A storage gate pixel operates such that the storage gate is not required to have the same capacity as a photodiode of the pixel. This provides greater fill factor for the pixel and a higher signal to noise ratio.

59 Claims, 9 Drawing Sheets

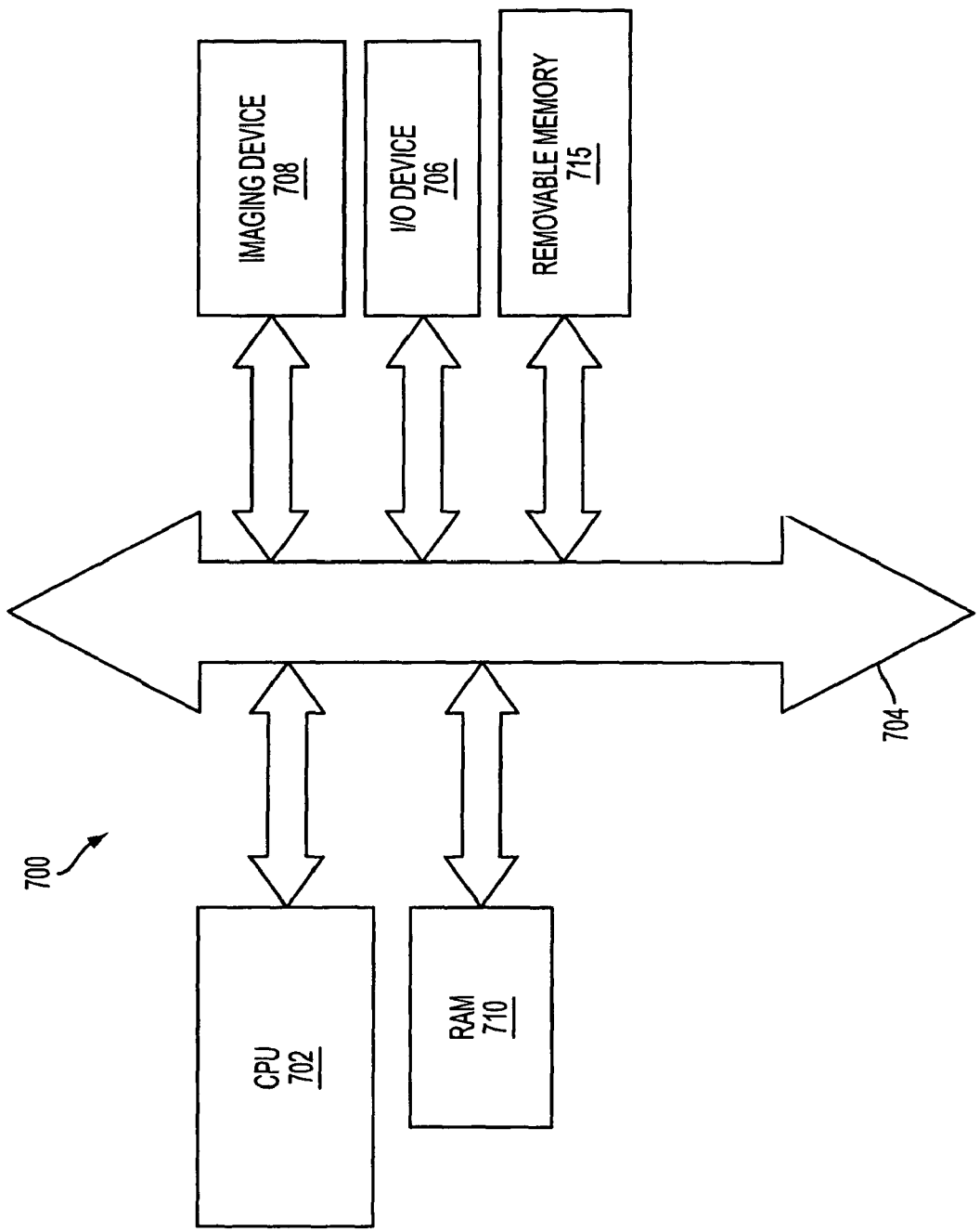

METHOD OF OPERATING A STORAGE GATE PIXEL

FIELD OF THE INVENTION

The present invention relates generally to imaging devices and more particularly to a method of operating a storage gate pixel in an imaging device.

BACKGROUND OF THE INVENTION

An image sensor circuit includes a focal plane array of pixel cells, each one of the cells including either a photogate, photoconductor, or photodiode overlying a charge accumulation region within a substrate for accumulating photo-generated charge. In a conventional four transistor CMOS imager, the active elements of a pixel cell perform: (1) photon to charge conversion; (2) accumulation of image charge; (3) transfer of charge to a floating diffusion region accompanied by charge amplification; (4) resetting the floating diffusion region to a known state before the transfer of charge to it; (5) selection of a pixel for readout; and (6) output and amplification of a signal representing pixel charge. In a three transistor pixel cell the active elements of a pixel cell perform: (1) photon to charge conversion; (2) accumulation of image charge by the photoconversion device; (3) resetting the photoconversion device to a known state before charge accumulation; (4) selection of a pixel for readout; and (5) output and amplification of a signal representing the pixel charge.

Referring to FIGS. 1A and 1B, a semiconductor wafer fragment of a conventional CMOS image sensor four-transistor (4T) pixel 10 is shown. A view of a section of the conventional pixel 10 taken along line 1B-1B of FIG. 1A is shown in FIG. 1B. The pixel 10 comprises a transfer gate 50 for transferring photoelectric charges generated in a pinned photodiode 21 to a floating diffusion region 25 acting as a sensing node. The floating diffusion region 25 is connected to a reset transistor having a reset gate 40 for resetting the region 25 with a drain terminal connected to a supply voltage, e.g. $V_{aapix}$. A source follower transistor having a gate 60 connected to region 25 and a row select transistor having a gate 80 are also included in the pixel 10. The pixel output is at the source of the row select transistor. Impurity doped source/drain regions 22 are provided about gates 40, 60, 80. Spacers 92 may be formed along the sides of gates 40, 50, 60, 80.

As shown in FIG. 1B, the photodiode 21 is illustratively a shallow pinned photodiode just beneath the surface 15 of substrate 20. The pinned photodiode 21 typically has a photosensitive p-n-p junction region comprising a p-type surface region 24 and an n-type photodiode region 26 within the p-type substrate 20. Trench isolation regions 28 are formed in the substrate 20 to isolate the pixel 10 from other pixels within a pixel array. Contacts 32 (FIG. 1A) may be formed in an insulating layer (not shown) to provide an electrical connection to the source/drain regions 22, floating diffusion region 25, and various transistor gates.

The performance of conventional image sensors, including CMOS image sensors, is often limited by a low signal-to-noise ratio (SNR) of the pixels, where SNR is a measure of the relative magnitude of a signal compared to the uncertainty or noise in the signal for each pixel. Low SNR reduces image quality and may be caused, for example, by high fixed pattern noise (FPN), and other factors such as poor sensitivity and high dark current. One common source of noise is pixel reset noise (or kT/C noise), which is often attributed to thermal noise uncertainty associated with a pixel reset level. In an imager, kT/C noise is the dominant source of temporal noise at low light levels.

Because a pixel signal $V_{sig}$ is measured relative to its reset level $V_{rst}$, high kT/C noise can interfere with the signal output from the pixel. Correlated double sampling (CDS) techniques and other techniques have been used in attempts to reduce pixel-level noise, including fixed pattern noise, and to increase the signal-to-noise ratio for integrating image sensors. However, conventional image sensor circuits are usually not capable of effectively reducing noise over a range of signal intensities such as, for example, different levels of light intensity. At high light levels, CDS techniques usually cannot reduce unwanted pixel noise in conventional image sensors.

Conventional image sensors are often not adequate for reducing all types of noise generated during image acquisition. At mid-high light levels, photon shot noise becomes the dominant noise source. Photon shot noise is often greater than kT/C noise associated with pixel reset. Reduction of photon shot noise requires averaging which requires multiple frames. In addition to the need to reduce noise, and because pixels are continually being scaled down in size, there is an increasing need to effectively reduce or eliminate noise to achieve a higher overall SNR, and to improve image quality.

It is therefore desirable to improve the design of pixel circuitry to effectively enhance SNR over a range of signal intensities and to improve global shutter operation. Such improved circuit design will yield improved output response even when pixel sizes are scaled down.

SUMMARY OF THE INVENTION

Exemplary embodiments of the invention provide devices and methods for effectively reducing pixel noise to achieve improved signal-to-noise ratio and thus, higher image quality in an imaging device.

According to one exemplary embodiment, a pixel with a storage gate is manufactured such that the storage gate does not have the same storage capacity as a photodiode. This configuration provides a greater fill factor for the pixel and a higher signal-to-noise ratio at low and mid-high noise levels.

In another exemplary embodiment, noise in an imager is reduced, and the signal-to-noise ratio of a pixel is enhanced, by storing photo-generated charge in a storage region of the pixel, determining whether the photo-generated charge exceeds the capacity of the storage region, and transferring a portion of the photo-generated charge to at least one diffusion region if the photo-generated charge exceeds the capacity of the storage region.

In yet another exemplary embodiment, noise in an imager is reduced, and the signal-to-noise ratio of a pixel is enhanced, by storing photo-generated charge in a storage region of the pixel, determining whether the photo-generated charge exceeds a predetermined threshold of the storage region, and transferring a portion of the photo-generated charge to at least one diffusion region if the photo-generated charge exceeds a predetermined threshold of the storage region.

BRIEF DESCRIPTION OF THE DRAWINGS

The foregoing and other advantages and features of the invention will become more apparent from the detailed description of exemplary embodiments provided below with reference to the accompanying drawings, in which:

FIG. 7 shows a processor system incorporating at least one imaging device constructed in accordance with an exemplary embodiment of the invention.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and logical changes may be made without departing from the spirit or scope of the present invention.

The terms "substrate" and "wafer" can be used interchangeably in the following description, and may include any semiconductor structure in or at a surface of which circuitry can be formed. The structure can include any of silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form layers, regions or junctions in or over the base semiconductor or foundation.

The term "pixel" refers to a picture element unit cell containing a photosensor and transistors for converting electromagnetic radiation to an electrical signal. For purposes of illustration, a representative pixel is described herein and, typically, fabrication of all pixels in an imager of the invention proceeds simultaneously in a similar fashion.

Figure 1A:
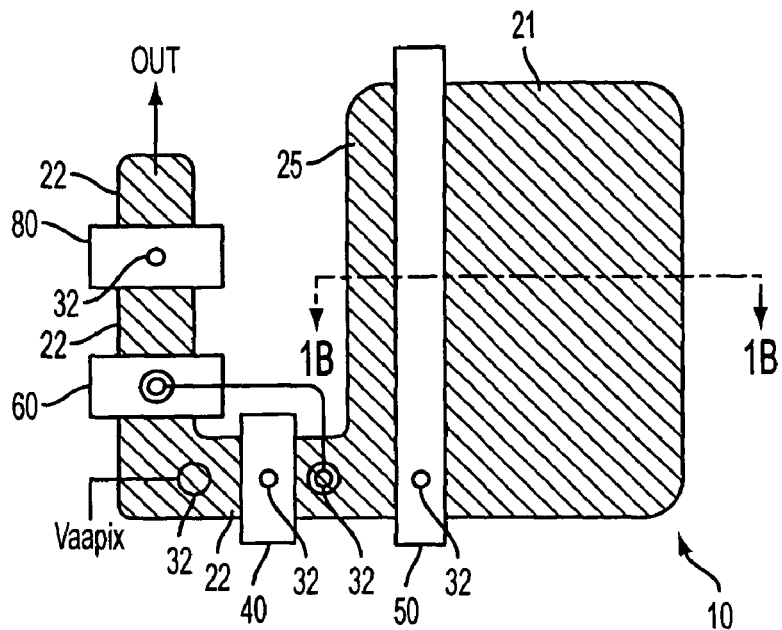
FIG. 1A is a top plan view of a conventional four transistor (4T) CMOS image sensor pixel fragment.
Figure 1B:
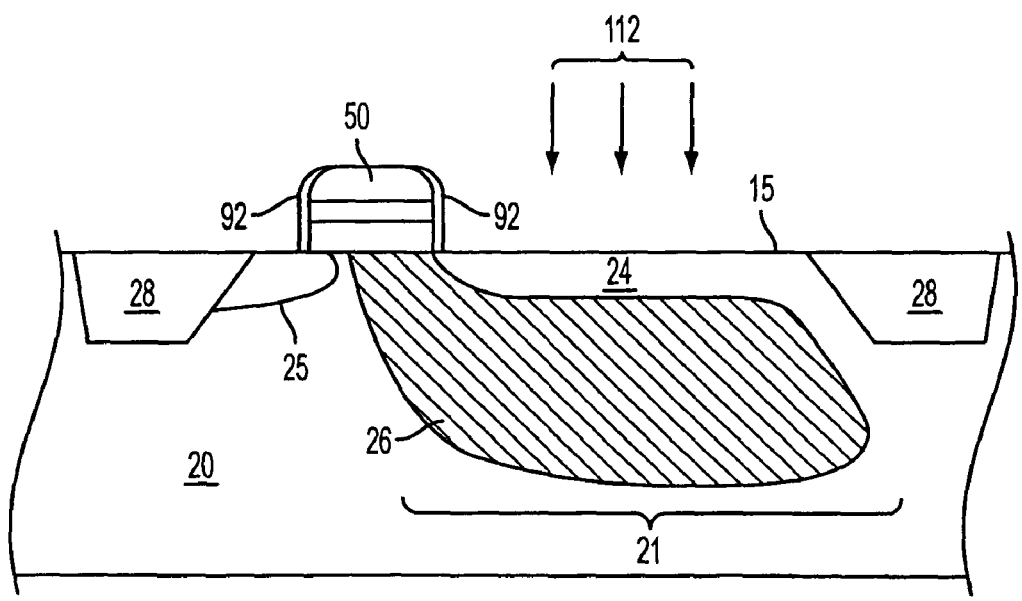
FIG. 1B is a side sectional view of the FIG. 1A image sensor pixel fragment taken along line 1B-1B.
Figure 2:
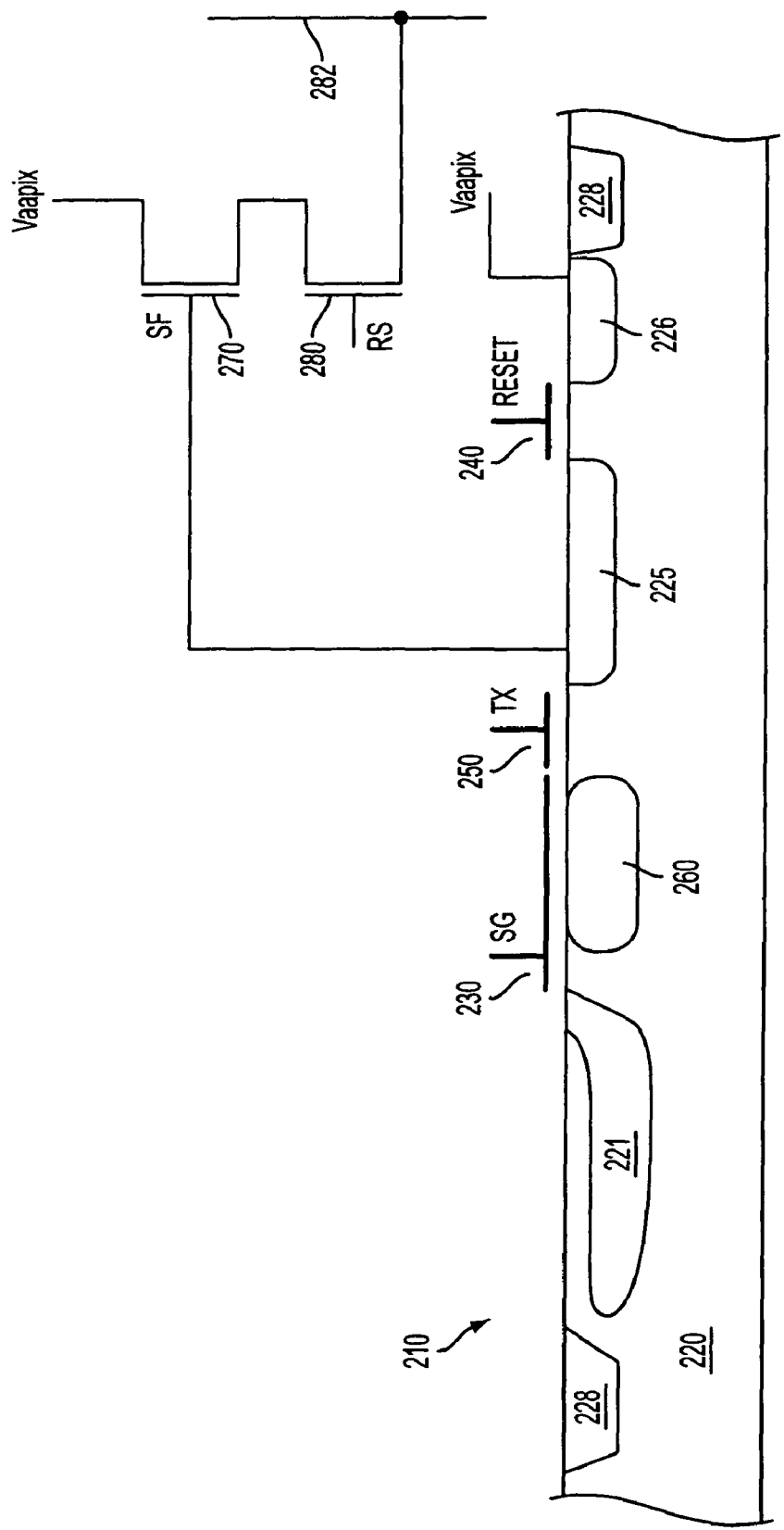
FIG. 2 illustrates a storage gate pixel constructed in accordance with one exemplary embodiment of the invention.

Referring to FIG. 2, a storage gate pixel 210 constructed in accordance with one exemplary embodiment of the invention is shown. The pixel 210 comprises a photodiode 221 beneath the surface of substrate 220. A trench isolation region 228 is formed in the substrate 220 to isolate the pixel 210 from other pixels within a pixel array. Photoelectric charge is collected within photodiode 221. The pixel 210 also comprises a storage gate 230 and associated charge storage region 260 and a transfer gate 250 for transferring photoelectric charge 223 from storage region 260 to a floating diffusion region 225 acting as a sensing node. The floating diffusion region 225 is connected to a reset transistor having a reset gate 240 for resetting the region 225 from a drain region 226 which is connected to a supply voltage $V_{aapix}$. A source follower (SF) transistor having a gate 270 connected to the floating diffusion region 225, a row select (RS) transistor serially connected with the source follower transistor and having a gate 280, and column output line 282 are also included in the pixel 210 (for convenience purposes the source follower and row select transistors are shown in electrical schematic form).

FIGS. 3A through 3D depict a series of potential diagrams for the operation of a storage gate pixel 210 (FIG. 2). According to the operation as depicted in FIGS. 3A through 3D, a floating diffusion region 225 and storage gate 230 provide for low noise operation at low signal levels by using the storage gate 230 for global shutter.

Figure 3A:
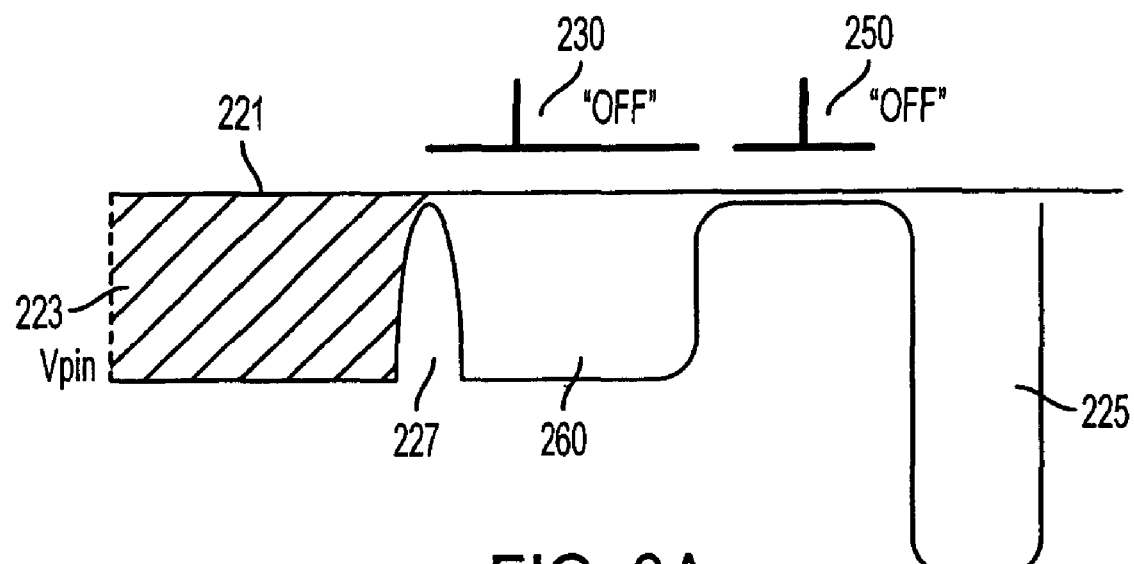
FIG. 3A is a potential diagram of a storage gate pixel operation during a low signal integration period in accordance with one exemplary embodiment of the invention.

Turning to FIG. 3A, the potential diagram illustrates a global storage gate pixel operation during an integration period for a low level light signal. A low level signal is based on low light intensity striking the photodiode 221, and a high level signal is based on high light intensity striking the photodiode 221. After a low level signal strikes the photodiode 221, photon to charge conversion occurs and there is accumulation of photo-generated charge 223 in a charge accumulation region of photodiode 221.

During this period of charge accumulation, both the storage gate 230 and transfer gate 250 are off, and an implanted barrier 227 is utilized to prevent transfer of accumulated charge to the storage area 260 and floating diffusion region 225. According to one embodiment of the invention, the storage capacity of storage area 260 is less than the capacity of the charge accumulation region of the photodiode 221, e.g. about half the size. This allows the photodiode 221 to have a large fill factor and collect more photons. This higher storage capacity of the photodiode provides a greater fill factor for the pixel and a higher signal-to-noise ratio at both low signal and high signal levels.

Figure 3B:
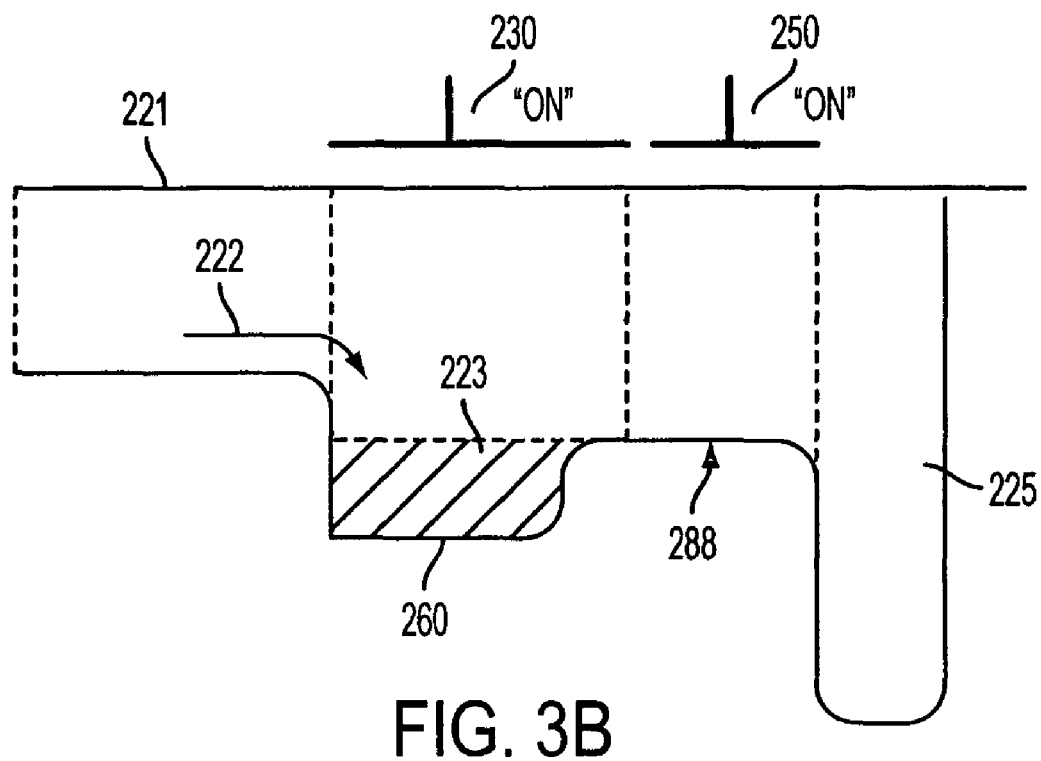
FIG. 3B is a potential diagram of a storage gate pixel operation during a low signal storage phase in accordance with the exemplary embodiment of FIG. 3A.

Turning to FIG. 3B, the potential diagram illustrates a global operation of a storage gate pixel 210 during a storage phase for a low level signal. As shown in FIG. 3B, during the storage phase, both the storage gate 230 and transfer gate 250 are turned on. After removal of the barrier 227 by activation of gate 230, there is a transfer 222 of photo-generated charge 223 from the charge accumulation region of photodiode 221 to storage area 260. The charge transfer barrier controlled by the transfer gate 250 is lowered, but is not lowered completely, thereby leaving a lower barrier 288 for transfer of charge to floating diffusion region 225. The partial lowering of the transfer gate barrier is set by the gate voltage applied to transfer gate 250. With a low level signal, and the lowered barrier 288, substantially all of the photo-generated charge 223 remains in storage area 260, and floating diffusion region 225 remains empty.

Figure 3C:
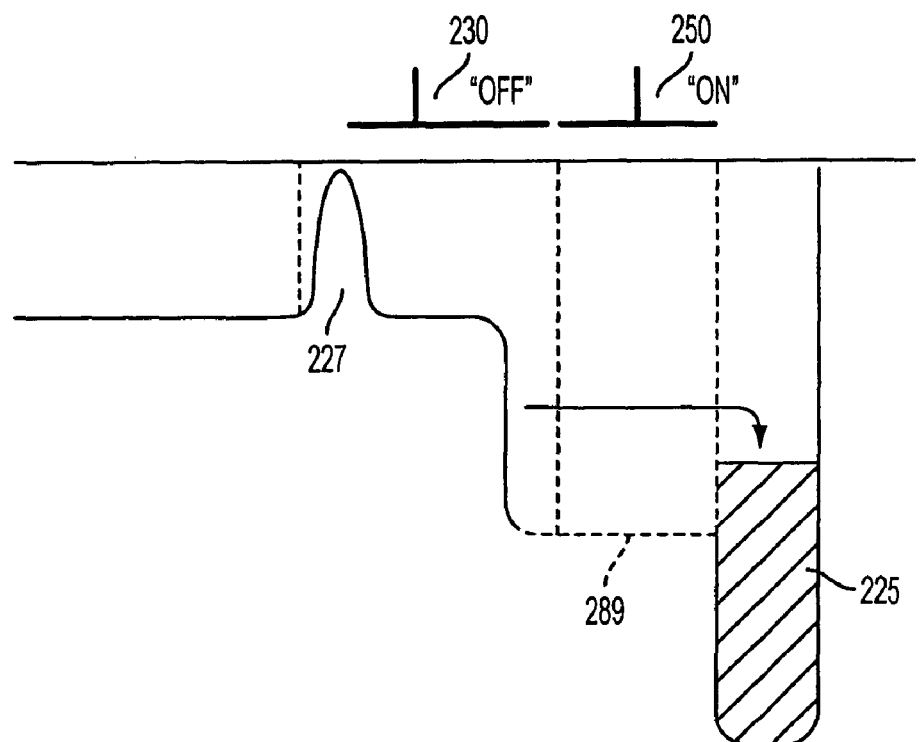
FIG. 3C is a potential diagram of a storage gate pixel operation at a stage subsequent to that depicted in FIG. 3B.

Turning to FIG. 3C, the potential diagram illustrates an operation of a storage gate pixel 210 during a charge transfer phase for a low level signal. The transfer of charge occurs globally, wherein the storage gate 230 is used for global shutter. After completion of the transfer of photo-generated charge 223 to storage area 260, as depicted in FIG. 3B, storage gate 230 is switched back to the off state, raising barrier 227. Implanted barrier 227 is utilized to prevent subsequent transfer of accumulated charge to the storage area 260 and floating diffusion region 225. As depicted in FIG. 3C, in order to read a signal representing the pixel charge, transfer gate 250 is then turned on completely, lowering barrier 288 to a level 289 below the bottom of charge storage region 260, and the charge accumulated in charge storage region 260 is transferred to floating diffusion region 225. Before transfer of charge to the floating diffusion region 225, the floating diffusion region 225 is reset to a known state by activation of a reset transistor having a reset gate 240 (as depicted in FIG. 2). This reset operation operates to erase any overflow charge from a previous signal. After transfer of photo-generated charge from the photodiode 221 to the storage area 260, a row of pixels is selected for readout. After row selection, the signal is output utilizing, for example, column output line 282. After signal output, amplification of the signal occurs, wherein the signal represents the pixel charge collected and transferred to the floating diffusion region 225.

Figure 3D:
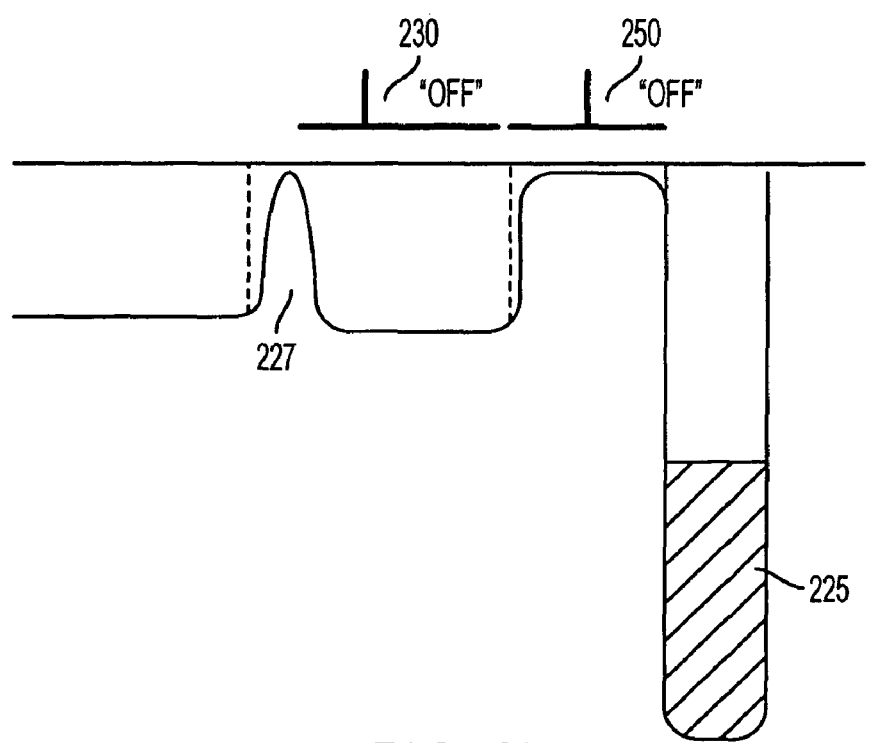
FIG. 3D is a potential diagram at the completion of a storage gate pixel operation for a low signal input in accordance with one exemplary embodiment of the invention.

FIG. 3D illustrates the completion of the storage gate pixel operation for a low level signal. After completion of the transfer of photo-generated charge 223 to the floating diffusion region 225, which occurs globally, both the storage gate 230 and the transfer gate 250 are switched back to the off state. This occurs globally for all pixels, raising barrier 227 and the barrier for the transfer gate 250. The signal level of the floating diffusion region 225 is then sampled row by row.

FIGS. 4A through 4D depict a series of potential diagrams for the operation of a storage gate pixel 210 (FIG. 2) during an integration period for a high level light signal. After the high level signal strikes the photodiode 221, photon to charge conversion occurs and there is an accumulation of photo-generated charge 223 in a charge accumulation region of photodiode 221. Photodiode 221 may be, for example, a pinned photodiode. In the case of a pinned photodiode, the pinned photodiode is characterized by a pin potential ($V_{pin}$), which is a highest applied voltage of the p-n-p photodiode. During this period of charge accumulation, both the storage gate 230 and transfer gate 250 are off, and an implanted barrier 227 is utilized to prevent transfer of accumulated charge to storage area 260 and floating diffusion region 225.

Figure 4A:
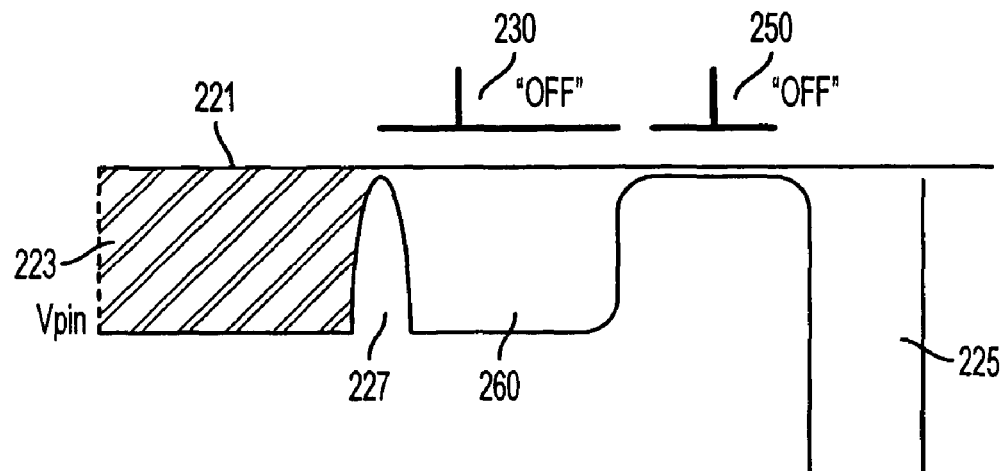
FIG. 4A is a potential diagram of a storage gate pixel operation during a high signal integration period in accordance with one exemplary embodiment of the invention.
Figure 4B:
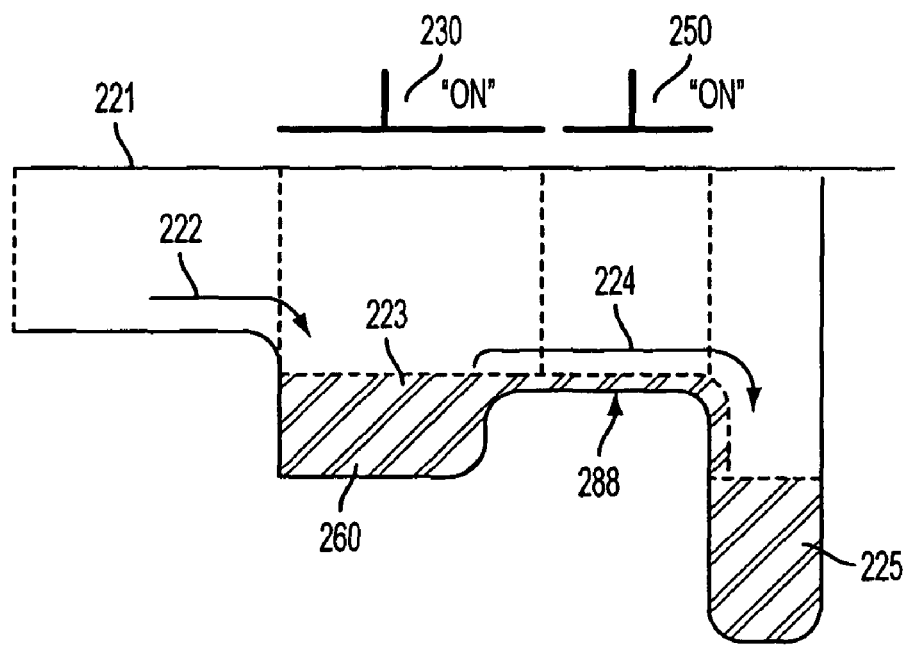
FIG. 4B is a potential diagram of a storage gate pixel operation during a high signal storage phase in accordance with one exemplary embodiment of the invention.

Turning to FIG. 4B, the potential diagram illustrates an operation of a storage gate pixel during a storage phase for the high level signal. As shown in FIG. 4B, during the storage phase, barrier 227 is removed by activation of gate 230. After removal of the barrier 227 by activation of gate 230, there is a transfer (222) of photo-generated charge 223 from the charge accumulation region of photodiode 221 to storage area 260. The transfer gate 250 is partially turned on and the charge transfer barrier controlled by the transfer gate 250 is lowered, but is not lowered completely, thereby leaving a lower barrier 288 for transfer of charge to floating diffusion region 225. The partial lowering of the transfer gate barrier is set by the gate voltage applied to transfer gate 250. With a high level signal, which is based on high light intensity, for example, and with the lowered barrier 280, excess photo-generated charge 223 is transferred (224) from storage area 260 to floating diffusion region 225. Before transfer of charge to the floating diffusion region 225, the floating diffusion region 225 is reset to a known state by activation of a reset transistor having a reset gate 240 (as depicted in FIG. 2). This reset operation operates to read-out any overflow charge from a previous signal. After transfer of photo-generated charge from the storage area 260 to the floating diffusion region 225, the pixel is selected for readout. After pixel selection, the signal is output utilizing, for example, column output line 282. After signal output, amplification of the signal occurs, wherein the signal represents the pixel charge collected and transferred to the floating diffusion region 225. In this manner, for example, under high signal conditions, charge is stored by utilizing the capacities of both the storage gate 230 and the floating diffusion region 225.

Figure 4C:
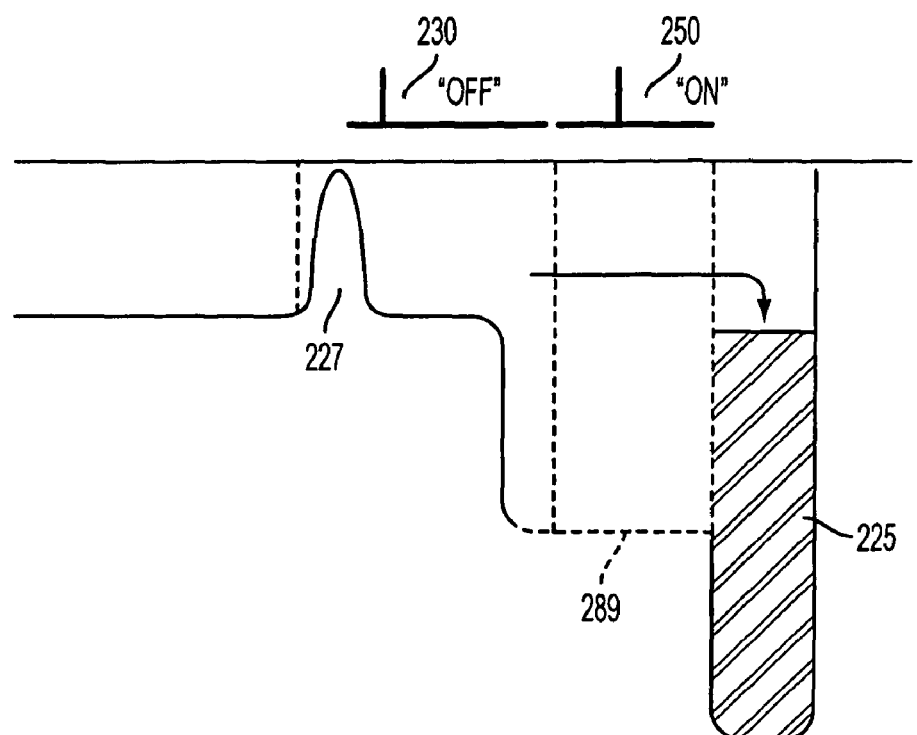
FIG. 4C is a potential diagram of a storage gate pixel operation at a stage subsequent to that depicted in FIG. 4B.

FIG. 4C illustrates a charge transfer phase of the storage gate pixel operation for a high level signal. As depicted in FIG. 4C, storage gate 230 is switched back to the off state, raising barrier 227. Implanted barrier 227 is utilized to prevent subsequent transfer of accumulated charge to the storage area 260 and floating diffusion region 225. In order to read a signal representing the pixel charge, transfer gate 250 is then turned on completely, lowering barrier 288 to a level 289 below the bottom of charge storage region 260, and the charge accumulated in charge storage region 260 is transferred to floating diffusion region 225. Before transfer of charge to the floating diffusion region 225, the floating diffusion region 225 is reset to a known state by activation of a reset transistor having a reset gate 240 (as depicted in FIG. 2). This reset operation operates to erase any overflow charge from a previous signal. After transfer of photo-generated charge from the photodiode 221 to the storage area 260, a row of pixels is selected for readout. After row selection, the signal is output utilizing, for example, column output line 282. After signal output, amplification of the signal occurs, wherein the signal represents the pixel charge collected and transferred to the floating diffusion region 225.

Figure 4D:
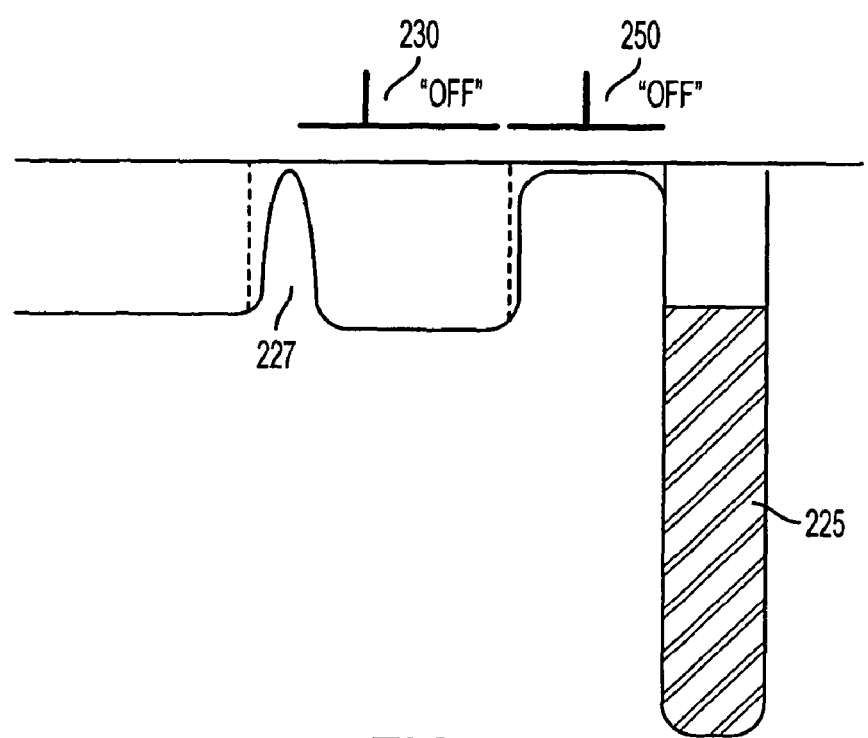
FIG. 4D is a potential diagram at the completion of a storage gate pixel operation for a high signal input in accordance with one exemplary embodiment of the invention.

FIG. 4D illustrates the completion of the storage gate pixel operation for a high level signal. After completion of the transfer of photo-generated charge 223 to the floating diffusion region 225, which occurs globally, both the storage gate 230 and the transfer gate 250 are switched back to the off state. This occurs globally for all pixels, raising barrier 227 and the barrier for the transfer gate 250. The signal level of the floating diffusion region 225 is then sampled row by row.

According to one embodiment of the invention, a controller or other processor sets a threshold for determining whether at least a portion of the charge accumulated in the storage area 260 will be transferred to the floating diffusion region 225. The threshold may be set based on the capacity of the storage area or floating diffusion region. Under low signal level conditions as depicted, for example, in FIGS. 3A through 3D, accumulation of charge in the storage area 260 does not exceed the threshold set by a controller or other processor. Therefore, no charge is transferred to floating diffusion region 225. However, under high signal level conditions as depicted, for example, in FIGS. 4A through 4D, accumulation of charge in the storage area 260 exceeds the threshold set by the controller or other processor, and charge is transferred to the floating diffusion region 225.

Figure 5:
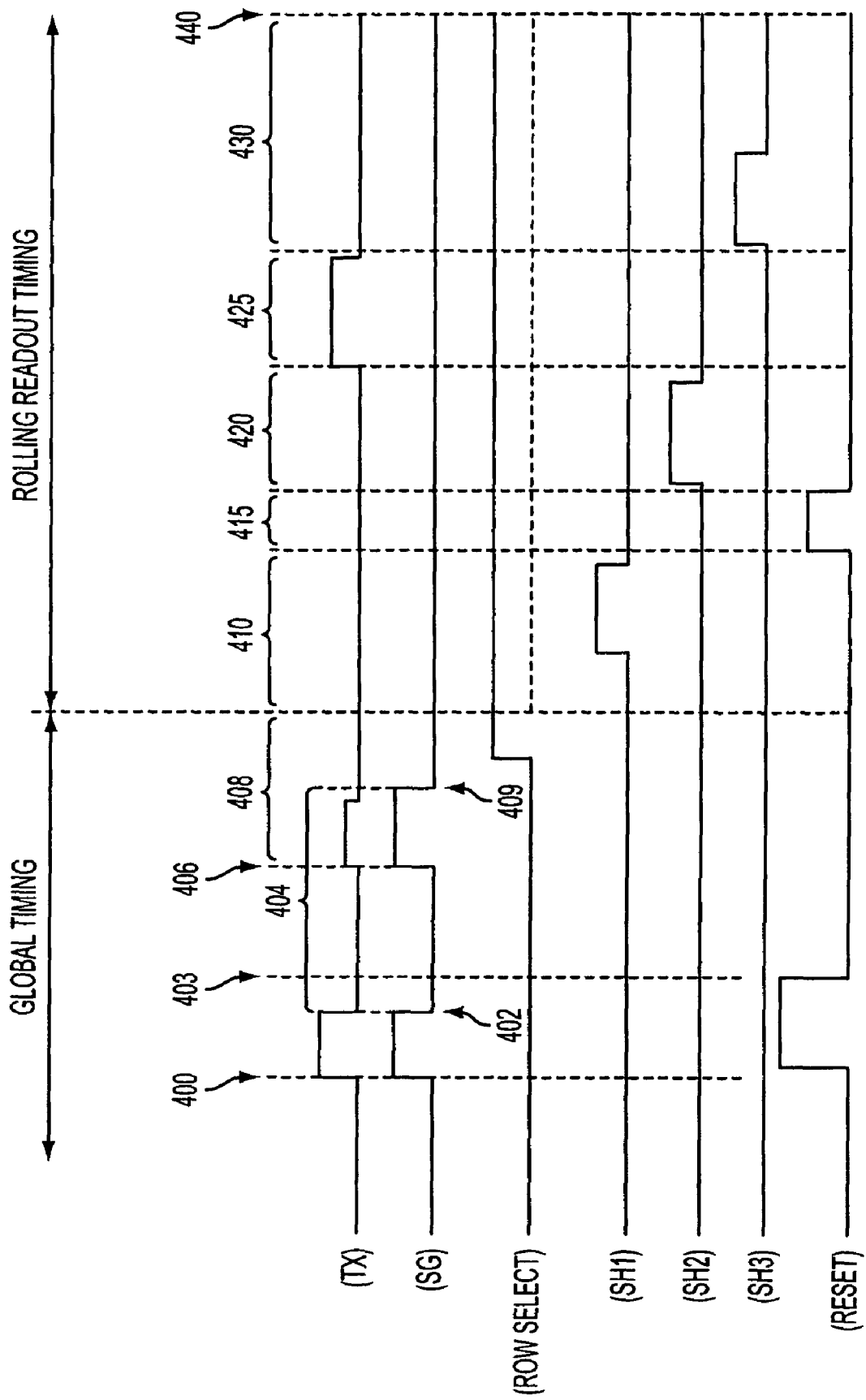
FIG. 5 illustrates a timing diagram of the operation of a pixel constructed in accordance with an exemplary embodiment of the invention.

FIG. 5 illustrates a timing diagram of the operation of a pixel constructed in accordance with one embodiment of the invention. As shown in FIG. 5, at time interval 400, storage gate 230 (SG), transfer gate 250 (TX) and reset gate 240 (Reset) are each turned on. Storage gate 230 (SG), transfer gate 250 (TX) and reset gate 240 (Reset) may also be programmed to turn on a desired or necessary by at least one programmable means. In this manner, activation of the reset gate 240 operates to remove any remaining charge in the pixel from a prior signal. Time interval 402 represents the start of the integration period 404, where integration begins globally for all pixels, and at which time charge is collected in a charge accumulation region of photodiode 221. The integration period lasts throughout interval 404 and ends at time interval 409. Time interval 403 represents when reset gate 240 is switched back to the off state.

As further depicted in FIG. 5, the storage gate 230 is then turned on completely at time interval 406, which operates to transfer charge 223 from the charge accumulation region of photodiode 221 to storage area 260 (as shown in FIG. 4B). The storage gate 230 may also be programmed to turned on at time interval 406. The transfer of charge 223 from the charge accumulation region of photodiode 221 to storage area 260 may also be controlled by a programmed transfer of charge, by at least one programmable means, for example, in response to prior programming by a controller or user.

Transfer gate 250 is partially turned on at time interval 406, which operates to transfer any excess charge 223 from the storage area 260 to the floating diffusion region 225, and which occurs globally for all pixels. The partial turning on of transfer gate 250 may also be controlled by prior programming, by at least one programmable means, for example, in response to prior programming by a controller or user. In this manner, a user or controller may control the transfer of any excess charge 223 from storage area 260 to floating diffusion region 225.

During interval 408, the transfer gate 250 is switched back to the off state, reestablishing the barrier between the storage area 260 and the floating diffusion region 225. As depicted in FIG. 5, the storage gate 230 is then switched back to the off state at time interval 409, completing the integration period 404 and the global storage operation.

The row select signal also turns on during interval 408 to activate gate 280 (FIG. 2), and remains on throughout interval 430, to allow the three sample and hold signals (SH1, SH2 and SH3) to be generated, causing three signals corresponding to shared charges within the pixel to be sampled. SH1, SH2, SH3 are control signals for sampling the pixels signals at three different times, as explained below.

As shown in FIG. 5, the first sample and hold signal (SH1) causes sample and hold circuitry to store the floating diffusion signal during interval 410, before reset (415), to read-out any overflow charge. SH1 is used to sample Vsig(1), which corresponds to the overflow charge transferred to the floating diffusion region 225. Activation of a reset transistor having a reset gate 240 (as depicted in FIG. 2) occurs during interval 415, for resetting the floating diffusion region 225 to VAAPIX.

During interval 420, a second sample and hold signal (SH2), used to sample and hold Vrst, causes sample and hold circuitry to store the floating diffusion signal after reset. After sampling Vrst, in order to read a signal representing the pixel charge, transfer gate 250 (TX) is turned on (as depicted in FIG. 4C), during interval 425. When transfer gate 250 is turned on, the charge remaining in storage area 260 is transferred to floating diffusion region 225. At this stage, a third sample and hold signal (SH3) is generated to sample and hold Vsig(2) during interval 430, to store the floating diffusion signal corresponding to the transfer of remaining photo-generated charge from the storage area 260 to the floating diffusion region 225.

After transfer of remaining charge to the floating diffusion region 225, the pixel is selected for readout. The signal is output utilizing, for example, column output line 282. Amplification of the signal also occurs during signal readout. As depicted in FIG. 5, time interval 440 represents when the pixels in the sampled row are read out one by one. A column circuit detects if the SH3 signal is above a certain level and, if so, the SH1 and SH3 signals are added together before being read out. This decision can be made in a column parallel fashion so as not to slow down the readout.

The events occurring from interval 410 through interval 440, as described above, may be repeated for every row in the image. A decoder or other selection circuit may be used to select which row is being sampled. Since the storage gate 230 is turned off during the readout time, e.g. the interval comprising 410 through 440 that is repeated for every row, and the photodiode 221 is isolated from the rest of the pixel, the next exposure time can overlap the readout time.

Referring to FIGS. 4A-4C and the timing diagram shown in FIG. 5, non-correlated double sampling (non-CDS) is performed for the high level signal. This non-CDS of the high-level signal, which corresponds to the overflow (excess) charge that was transferred to the floating diffusion region 225 from the storage area 260 during the storage phase (see FIG. 4B), is obtained by calculating the difference between Vrst & Vsig(1). Correlated double sampling (CDS) of the storage gate signal, corresponding to the charge stored only in the storage gate, is performed by calculating the difference between Vsig(2) and Vrst.

Under conditions in which the storage gate signal (Vsig(2)−Vrst) is high enough, which will usually correspond to a charge level less than the full well capacity of the storage gate to avoid fixed pattern noise (FPN), the floating diffusion signal (Vrst−Vsig(1)) is added to the storage gate signal (Vsig(2)−Vrst). Alternatively, the storage gate portion of the signal (Vsig(2)−Vrst) may be used alone, since the floating diffusion signal (Vrst−Vsig(1)) may have kT/C noise. The invention may also reduce or eliminate FPN during the storage phase by adding the floating diffusion signal (Vrst−Vsig(1)) and the storage gate signal (Vsig(2)−Vrst) together, for example when the storage gate signal is high.

Figure 6:
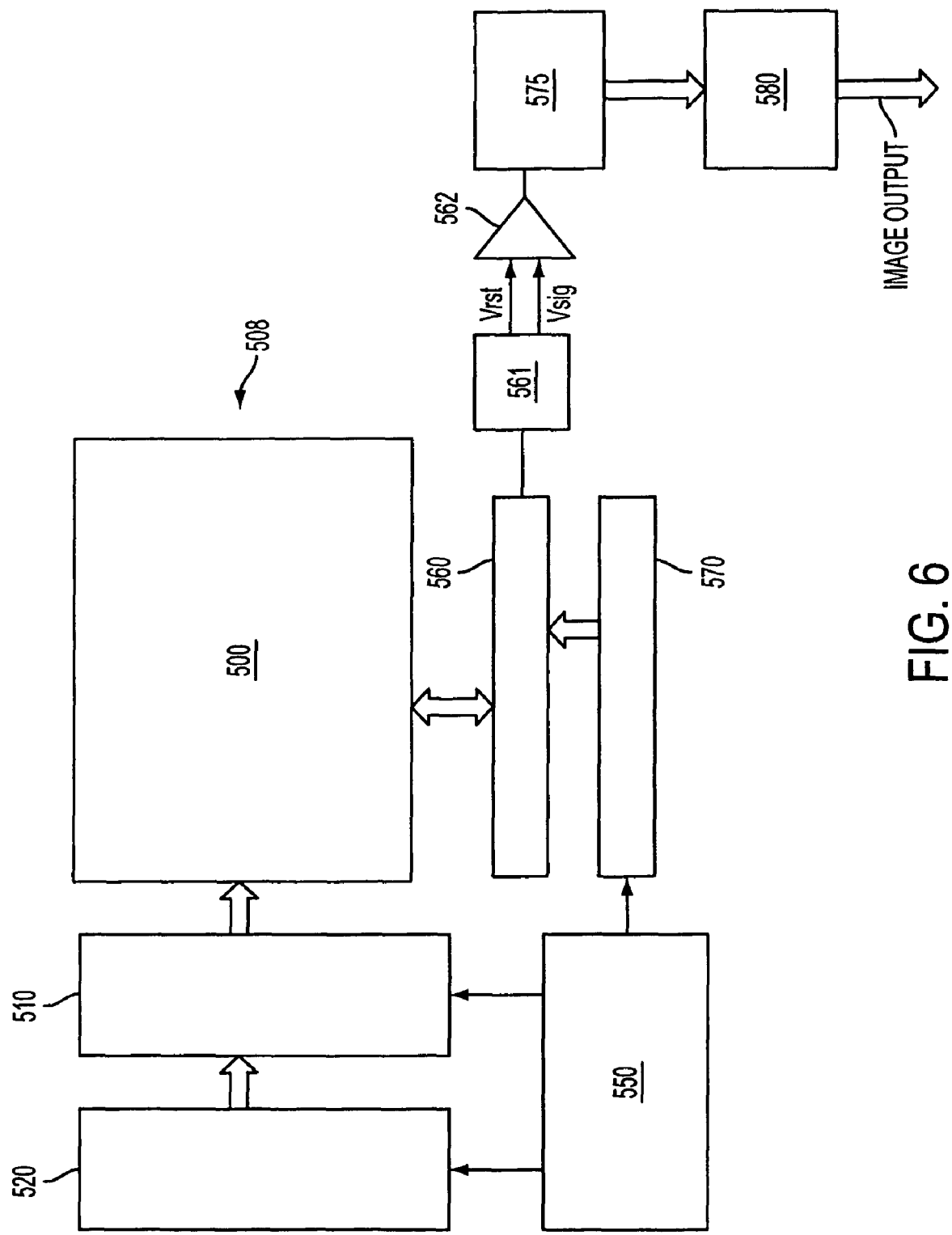
FIG. 6 illustrates a block diagram of a CMOS imager integrated circuit having a pixel array according to an exemplary embodiment of the invention.

FIG. 6 illustrates a block diagram of a CMOS imager integrated circuit (IC) 508 having a pixel array 500 containing a plurality of pixels arranged in rows and columns, according to an exemplary embodiment of the invention. The pixels of each row in array 500 are all turned on at the same time by a row select line, and the pixels of each column are selectively output on column lines by respective column select lines.

The row lines are selectively activated by a row driver 510 in response to row address decoder 520. The column select lines are selectively activated by a column driver 560 in response to column address decoder 570. The pixel array 500 is operated by a timing and control circuit 550, which controls address decoders 520, 570 for selecting the appropriate row and column lines for pixel signal readout. The timing and control circuit 550 may be used to generate timing signals to selectively operate the pixel's storage gate 230 (FIGS. 3A-3B or FIGS. 4A-4B).

The pixel column signals, which typically include a pixel reset signal (Vrst), sampled and held by SH2, and a pixel image signal (Vsig), which is determined from the floating diffusion signal (Vrst−Vsig(1)) and the storage gate portion of the signal (Vsig(2)−Vrst), are read by a sample and hold circuit 561. A differential signal ($V_{rst}-V_{sig}$) is produced by and amplified by differential amplifier 562 for each column or column per chip. The differential signal is digitized by analog-to-digital converter 575 (ADC). The analog-to-digital converter 575 supplies the digitized pixel signals to an image processor 580, which can perform image processing.

FIG. 7 shows system 700, a typical processor system modified to include an imaging device 708 constructed in accordance with an embodiment of the invention. The processor-based system 700 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 700, for example a camera system, generally comprises a central processing unit (CPU) 702, such as a microprocessor, that communicates with an input/output (I/O) device 706 over a bus 704. Imaging device 708 also communicates with the CPU 702 over the bus 704. The processor-based system 700 also includes random access memory (RAM) 710, and can include removable memory 715, such as flash memory, which also communicate with the CPU 702 over the bus 704. The imaging device 708 may be combined with a processor, such as a CPU, digital signal processor, or microprocessor, with or without memory storage on a single integrated circuit or on a different chip than the processor.

While the above-described embodiments of the invention relate to pixel cells comprising at least one storage gate, in which transfer of photo-generated charge depends at least on the intensity of the signal received, one skilled in the art will recognize that the broad scope of the invention includes other types of pixel cells and imager devices separately or integrated with one or more processing components in a semiconductor device. Operation of the storage gate of the invention enables an image device, for example, to achieve a high signal-to-noise ratio, and optimized charge storage capacity under any type of light conditions.

Although one embodiment of the invention is described above for use in a pixel cell for a CMOS image sensor, the broad scope of the invention is not limited to such and may be applicable to other types of image sensors, and to pixel cells having any number of transistors. Further, although one storage gate is illustrated and described with reference to FIGS. 2-5, it should be understood that more than one storage gate may be utilized in the invention.

It should also be understood that the invention is applicable to pixel cells in any arrangement and orientation for integration with other components of a semiconductor device. The invention may optionally include photogates, photoconductors, or other image-to-charge converting devices, in lieu of photodiodes, for initial accumulation of photo-generated charge.

The above description and drawings illustrate embodiments which achieve the objects of the present invention. Although certain advantages and embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. A method of operating an imager, comprising:
   accumulating photo-generated charge in at least one charge accumulation region;
   transferring at least a first portion of said photo-generated charge to at least one storage region;
   transferring a second portion of said first portion of said photo-generated charge from said at least one storage region to at least one charge collection region if said at least a first portion of said photo-generated charge exceeds a predetermined threshold;
   sampling a signal generated from said second portion stored at said at least one charge collection region;
   after sampling said signal generated from said second portion, transferring a remaining portion of said first portion of said photo-generated charge stored in said at least one storage region to said at least one charge collection region; and
   sampling a signal generated from said remaining portion stored at said at least one charge collection region.

2. The method of claim 1, wherein said at least one charge collection region comprises at least one floating diffusion region.

3. The method of claim 1, wherein sampling a signal generated from said second portion comprises sampling a signal generated from a reset charge stored at said at least one charge collection region and sampling said signal generated from said second portion stored at said at least one charge collection region.

4. The method of claim 1, wherein said second portion is approximately an amount of photo-generated charge by which said first portion of photo-generated charge exceeds said predetermined threshold.

5. The method of claim 1, wherein said at least a first portion is substantially all of said photo-generated charge accumulated in said at least one charge accumulation region.

6. The method of claim 1, further comprising resetting said charge collection region with a reset charge after sampling said signal generated from said second portion and before transferring said remaining portion.

7. The method of claim 1, wherein transferring said second portion from said at least one storage region to said at least one charge collection region further comprises partially lowering a charge transfer barrier between said at least one storage region and said at least one charge collection region, and
   wherein transferring said remaining portion to said at least one charge collection region further comprises further lowering said charge transfer barrier.

8. A pixel circuit, comprising:
   at least one charge accumulation region for accumulating photo-generated charge;
   at least one storage region for storing at least a first portion of said photo-generated charge;
   means for transferring a second portion of said photo-generated charge from said at least one storage region to at least one charge collection region if said first portion of said photo-generated charge exceeds a predetermined threshold;
   means for sampling a signal generated from said second portion stored at said at least one charge collection region; and
   means for sampling a signal generated from a remainder of said first portion of said photo-generated charge after sampling said signal generated from said second portion.

9. The pixel circuit of claim 8, wherein said at least one charge collection region comprises at least one floating diffusion region.

10. The pixel circuit of claim 8, wherein said second portion is approximately an amount of photo-generated charge by which said first portion of photo-generated charge exceeds said predetermined threshold.

11. The pixel circuit of claim 8, wherein a capacity of said at least one charge accumulation region is greater than a capacity of said at least one storage region.

12. The pixel circuit of claim 8, wherein said means for sampling a signal generated from said second portion comprises means for performing at least one non-correlated double sampling operation and said means for sampling a signal generated from said remainder comprises means for performing at least one correlated double sampling operation.

13. The pixel circuit of claim 8, wherein said means for transferring said second portion of the photo-generated charge comprises at least one programmable means configured to partially lower a charge transfer barrier configured to prevent transfer of photo-generated charge from said at least one storage region to said at least one charge collection region.

14. The pixel circuit of claim 8, wherein the pixel circuit is employed in a CMOS imager.

15. The pixel circuit of claim 8, further comprising means for resetting said charge collection region after sampling said signal generated from said second portion and before sampling said signal generated from said remainder of said first portion.

16. A method of operating a pixel of an imager with global shutter, comprising:
  accumulating photo-generated charge in an accumulation region;
  transferring at least a first portion of said photo-generated charge from said accumulation region to a storage region, wherein a capacity of said storage region is less than a capacity of said accumulation region;
  transferring a second portion of said first portion of said photo-generated charge from said storage region to at least one charge collection region if said at least a first portion of said photo-generated charge exceeds a set capacity of said at least one storage region;
  sampling a signal generated from said second portion stored at said at least one charge collection region;
  after sampling said signal generated from said second portion, transferring a remaining portion of said first portion of said photo-generated charge stored in said at least one storage region to said at least one charge collection region; and
  sampling a signal generated from said remaining portion stored at said at least one charge collection region.

17. The method of claim 16, wherein transferring said second portion from said at least one storage region to said at least one charge collection region further comprises partially lowering a charge transfer barrier between said at least one storage region and said at least one charge collection region, and
  wherein transferring said remaining portion to said at least one charge collection region further comprises further lowering said charge transfer barrier.

18. The method of claim 16, wherein said at least one charge collection region comprises at least one floating diffusion region.

19. The method of claim 16, further comprising:
  resetting said charge collection region with a reset charge after sampling said second portion and before transferring said remaining portion.

20. The method of claim 19, further comprising:
  sampling a signal generated by said reset charge stored at said charge collection region after resetting said charge collection region and prior to sampling said signal generated from said remaining portion stored at said at least one charge collection region.

21. A method of operating an imager, comprising:
  accumulating photo-generated charge in at least one charge accumulation region;
  raising a first charge transfer barrier to prevent transfer of said accumulated charge from said at least one charge accumulation region to at least one storage region;
  raising a second charge transfer barrier to prevent transfer of said accumulated charge from said at least one storage region to at least one charge collection region;
  lowering said first charge transfer barrier to transfer said photo-generated charge from said charge accumulation region to said at least one storage region;
  partially lowering said second charge transfer barrier, such that a portion of said photo-generated charge is transferred to said at least one charge collection region;
  sampling a first signal from said at least one charge collection region;
  raising said first charge transfer barrier and said second charge transfer barrier;
  resetting said at least one charge collection region;
  sampling a second signal from said at least one charge collection region;
  lowering the second charge transfer barrier, such that substantially all of said photo-generated charge is transferred to said at least one charge collection region;
  sampling a third signal from said at least one charge collection region; and
  outputting a pixel signal, wherein the pixel signal corresponds to said photo-generated charge transferred to said at least one charge collection region.

22. The method of claim 21, wherein said at least one charge collection region comprises at least one floating diffusion region.

23. The method of claim 21, further comprising the act of performing at least one correlated double sampling operation on the photo-generated charge to reduce low level noise.

24. The method of claim 21, further comprising performing at least one non-correlated double sampling operation on the photo-generated charge.

25. An integrated circuit comprising:
  a substrate;
  a pixel array in the substrate, each pixel in the pixel array comprising:
    a photosensor operable to receive photon energy and convert the photon energy to photoelectric charge;
    a floating diffusion region for receiving at least a portion of the photoelectric charge; and
    at least one storage gate operably connected between the floating diffusion region and the photosensor, each storage gate operable to store and separately transfer excess photoelectric charge and a remainder photoelectric charge from the photosensor to the floating diffusion region; and
  a circuit for sampling photoelectric charge, wherein said circuit for sampling is configured to perform a first sampling operation of said excess photoelectric charge in said floating diffusion region, and wherein said circuit for sampling is further configured to perform a second sampling operation of said remainder photoelectric charge in said floating diffusion region.

26. The integrated circuit of claim 25, further comprising means for resetting said charge collection region after sampling said signal generated from said second portion and before sampling said signal generated from said remainder of said first portion.

27. The integrated circuit of claim 25, wherein said photosensor is selected from a group consisting of a photodiode, photogate, and a photoconductor.

28. The integrated circuit of claim 25, wherein a capacity of said photosensor is greater than a capacity of said at least one storage gate.

29. The integrated circuit of claim 25, wherein the pixel array is a CMOS pixel array.

30. The integrated circuit of claim 25, further comprising a timing and control circuitry that generates a timing signal to selectively operate the at least one storage gate.

31. The integrated circuit of claim 25, further comprising a transfer transistor connected between said storage gate and said floating diffusion region, said transfer transistor including a charge transfer barrier,
- wherein said transfer transistor is configured to partially lower said charge transfer barrier when receiving a first transfer signal, and
- wherein said transfer transistor is configured to further lower said charge transfer barrier when receiving a second transfer signal.

32. An image pixel array in an imaging device, each pixel in the pixel array comprising:
- a photosensor operable to receive photon energy and convert the photon energy to photoelectric charge;
- a floating diffusion region for receiving at least a portion of the photoelectric charge; and
- at least one storage gate operably connected between the floating diffusion region and the photosensor, each storage gate operable to store and separately transfer excess photoelectric charge and a remainder photoelectric charge from the photosensor to the floating diffusion region,
- wherein said imaging device further comprises a circuit for sampling photoelectric charge, wherein said circuit for sampling is configured to perform a first sampling operation of said excess photoelectric charge in said floating diffusion region, and wherein said circuit for sampling is further configured to perform a second sampling operation of said remainder photoelectric charge in said floating diffusion region.

33. The image pixel array of claim 32, each pixel further comprising a transfer transistor connected between said storage gate and said floating diffusion region, said transfer transistor including a charge transfer barrier,
- wherein said transfer transistor is configured to partially lower said charge transfer barrier when receiving a first transfer signal, and
- wherein said transfer transistor is configured to further lower said charge transfer barrier when receiving a second transfer signal.

34. The image pixel array of claim 32, wherein each photosensor is selected from the group consisting of a photodiode, pinned photodiode, photogate, and photoconductor.

35. A method of operating an imager, comprising:
- accumulating photo-generated charge in at least one charge accumulation region;
- storing at least a first portion of said photo-generated charge in at least one storage region;
- transferring a second portion of said photo-generated charge from said at least one storage region to at least one charge collection region if said first portion of said photo-generated charge exceeds a predetermined threshold;
- performing a sampling operation related to said second portion;
- after performing said sampling operation related to said second portion, transferring a remaining portion of said first portion of said photo-generated charge stored in said at least one storage region to said at least one charge collection region; and
- performing a sampling operation related to said remaining portion stored at said at least one charge collection region.

36. The method of claim 35, wherein said at least one charge collection region comprises at least one floating diffusion region.

37. The method of claim 35, wherein said predetermined threshold corresponds to a capacity of said at least one storage region.

38. The method of claim 35, wherein said second portion is substantially all of said first portion of said photo-generated charge that exceeds the predetermined threshold.

39. The method of claim 35, wherein performing a sampling operation related to said second portion comprises performing at least one non-correlated double sampling operation related to said second portion to reduce low level noise.

40. The method of claim 35, further comprising transferring substantially all of said first portion from said at least one storage region to said at least one charge collection region if said at least a first portion of said photo-generated charge does not exceed said predetermined threshold.

41. The method of claim 35, wherein said predetermined threshold corresponds to a partially lowered charge transfer barrier.

42. The method of claim 35, further comprising resetting said at least one charge collection region with a reset charge after performing said sampling operation related to said second portion and before performing said sampling operation related to said remainder.

43. A pixel circuit, comprising:
- at least one charge accumulation region for accumulating photo-generated charge;
- at least one storage region for storing at least a first portion of said photo-generated charge;
- means for transferring a second portion of said photo-generated charge from said at least one storage region to at least one charge collection region if said first portion of said photo-generated charge exceeds a predetermined threshold,
- wherein said means for transferring said second portion comprises means for partially lowering a charge transfer barrier configured to prevent transfer of photo-generated charge from said at least one storage region to said at least one charge collection region;
- means for performing at least one sampling operation at said charge collection region of said second portion of said photo-generated charge;
- means for transferring a remaining portion of said photo-generated charge from said at least one storage region to at least one charge collection region after said sampling operation of said second portion; and
- means for performing at least one sampling operation at said charge collection region of said remaining portion.

44. The pixel circuit of claim 43, wherein said at least one charge collection region comprises at least one floating diffusion region.

45. The pixel circuit of claim 43, wherein said predetermined threshold corresponds to a capacity of said at least one storage region.

46. The pixel circuit of claim 43, wherein said second portion is substantially all photo-generated charge of said first portion that exceeds the predetermined threshold.

47. The pixel circuit of claim 43, wherein a capacity of said at least one charge accumulation region is greater than a capacity of said at least one storage region.

48. The pixel circuit of claim 43, wherein said means for transferring said second portion of the photo-generated charge comprises at least one programmable means.

49. The pixel circuit of claim 43, wherein the pixel circuit is employed in a CMOS imager.

50. A pixel circuit, comprising:
- at least one charge accumulation region for accumulating photo-generated charge;

at least one storage region for storing at least a portion of said photo-generated charge;

a first charge transfer barrier to prevent transfer of said photo-generated charge from said at least one charge accumulation region to said at least one storage region;

a second charge transfer barrier to prevent transfer of said photo-generated charge from said at least one storage region to at least one charge collection region;

means for lowering said first charge transfer barrier to transfer said photo-generated charge from said charge accumulation region to said at least one storage region;

means for partially lowering said second charge transfer barrier, such that a portion of said photo-generated charge is transferred to said at least one charge collection region;

sampling means for sampling a first signal from said at least one charge collection region;

means for raising said first charge transfer barrier and said second charge transfer barrier;

means for resetting said at least one charge collection region;

sampling means for sampling a second signal from said at least one charge collection region;

means for lowering the second charge transfer barrier, such that substantially all of said photo-generated charge is transferred to said at least one charge collection region;

sampling means for sampling a third signal from said at least one charge collection region; and output means for outputting a pixel signal, wherein the pixel signal corresponds to said photo-generated charge transferred to said at least one charge collection region.

51. The pixel circuit of claim 50, wherein said at least one charge collection region comprises at least one floating diffusion region.

52. The pixel circuit of claim 50, wherein said means for lowering said first charge transfer barrier comprises at least one programmable means.

53. The pixel circuit of claim 50, wherein said means for partially lowering said second charge transfer barrier comprises at least one programmable means.

54. The pixel circuit of claim 50, further comprising means for performing at least one correlated double sampling operation on the photo-generated charge to reduce low level noise.

55. The pixel circuit of claim 50, further comprising means for performing at least one non-correlated double sampling operation on the photo-generated charge.

56. An imager system, comprising:

a processor; and an imaging device coupled to said processor, said imaging device comprising:

a pixel array, each pixel in the pixel array comprising:

a photosensor operable to receive photon energy and convert the photon energy to photoelectric charge;

a floating diffusion region for receiving at least a portion of the photoelectric charge; and at least one storage gate operably connected between the floating diffusion region and the photosensor, each storage gate operable to store and separately transfer excess photoelectric charge and remainder photoelectric charge from the photosensor to the floating diffusion region; and a circuit for sampling photoelectric charge, wherein said circuit for sampling is configured to perform a first sampling operation of said excess photoelectric charge in said floating diffusion region, and wherein said circuit for sampling is further configured to perform a second sampling operation of a remainder photoelectric charge in said floating diffusion region.

57. The imager system of claim 56, further comprising a timing and control circuitry that generates a timing signal to selectively operate the at least one storage gate.

58. The imager system of claim 56, further comprising:

a reset transistor for resetting said floating diffusion region; and a control circuit configured to activate said reset transistor after said circuit for sampling performs said first sampling operation and before said circuit for sampling performs said second sampling operation.

59. The imager system of claim 56, each pixel further comprising a transfer transistor connected between said storage gate and said floating diffusion region, said transfer transistor including a charge transfer barrier, wherein said transfer transistor is configured to partially lower said charge transfer barrier when receiving a first transfer signal, and wherein said transfer transistor is configured to further lower said charge transfer barrier when receiving a second transfer signal.

* * * * *